(12) United States Patent
Ahmad et al.

(10) Patent No.: US 9,414,445 B2
(45) Date of Patent: Aug. 9, 2016

(54) METHOD AND APPARATUS FOR MICROWAVE TREATMENT OF DIELECTRIC FILMS

(71) Applicant: APPLIED MATERIALS, INC., Santa Clara, CA (US)

(72) Inventors: Iftikhar Ahmad, Raleigh, NC (US); Mikhail Baklanov, Veltem-Beisem (BE); Liping Zhang, Heverlee (BE)

(73) Assignee: APPLIED MATERIALS, INC., Santa Clara, CA (US)

(*) Notice: Subject to any disclaimer, the term of this patent is extended or adjusted under 35 U.S.C. 154(b) by 154 days.

(21) Appl. No.: 14/120,013

(22) Filed: Apr. 15, 2014

(65) Prior Publication Data

US 2014/0322921 A1    Oct. 30, 2014

Related U.S. Application Data

(60) Provisional application No. 61/854,556, filed on Apr. 26, 2013.

(51) Int. Cl.
| | |
|---|---|
| *H01L 21/00* | (2006.01) |
| *H05B 6/80* | (2006.01) |
| *H01L 21/02* | (2006.01) |
| *H01L 21/268* | (2006.01) |
| *H01L 21/67* | (2006.01) |

(52) U.S. Cl.
CPC ............ *H05B 6/80* (2013.01); *H01L 21/02203* (2013.01); *H01L 21/02321* (2013.01); *H01L 21/02345* (2013.01); *H01L 21/02359* (2013.01); *H01L 21/2686* (2013.01); *H01L 21/67115* (2013.01); *H01L 21/67167* (2013.01)

(58) Field of Classification Search
CPC .................. H01L 21/67176; H01L 21/67115; H01L 21/02345
See application file for complete search history.

(56) References Cited

U.S. PATENT DOCUMENTS

| | | | |
|---|---|---|---|
| 5,321,222 A | 6/1994 | Bible et al. | |
| 5,521,360 A | 5/1996 | Johnson et al. | |
| 5,648,038 A | 7/1997 | Fathi et al. | |
| 5,721,286 A * | 2/1998 | Lauf | H05B 6/686 522/1 |
| 5,738,915 A * | 4/1998 | Fathi | B05D 3/029 257/E21.241 |
| 5,900,289 A * | 5/1999 | Hartmann | C23C 16/26 427/162 |

(Continued)

OTHER PUBLICATIONS

Frot, T. et al. "Application of the Protection/Deprotection Strategy to the Science of Porous Materials," Advanced Materials XX: 1-5 (2011).

*Primary Examiner* — Laura Menz
(74) *Attorney, Agent, or Firm* — Moser Taboada; Alan Taboada

(57) ABSTRACT

A method for processing a dielectric film on a substrate comprises: depositing a porous dielectric film on a substrate; removing the porogen; stuffing the film with a protective polymeric material; performing at least one intermediate processing step on the stuffed dielectric film; placing the film in a microwave applicator cavity and heating to a first temperature to partially burn out the polymeric material; introducing a controlled amount of a polar solvent into the porosity created by the partial burn out; applying microwave energy to heat the film to a second selected temperature below the boiling point of the solvent to clean away remaining polymeric material; and applying microwave energy to heat the film to a third temperature above the boiling point of the solvent to completely burnout the residues of polymeric material. The interaction of the polar solvent with the microwaves enhances the efficiency of the cleaning process.

20 Claims, 5 Drawing Sheets

(56) References Cited

U.S. PATENT DOCUMENTS

| | | | | |
|---|---|---|---|---|
| 5,961,871 A * | 10/1999 | Bible | | H05B 6/686 219/709 |
| 7,939,456 B2 * | 5/2011 | Ahmad | | H05B 6/806 219/702 |
| 8,021,898 B2 * | 9/2011 | Ahmad | | H01L 21/67248 219/411 |
| 8,872,154 B2 * | 10/2014 | Franklin | | B82Y 10/00 257/9 |
| 9,054,052 B2 * | 6/2015 | Licausi | | H01L 21/314 |
| 2003/0232495 A1 * | 12/2003 | Moghadam | | B05D 1/60 438/623 |
| 2004/0069410 A1 * | 4/2004 | Moghadam | | B05D 1/60 156/345.32 |
| 2009/0320914 A1 * | 12/2009 | Yun | | H01G 9/2031 136/255 |
| 2010/0295023 A1 * | 11/2010 | Franklin | | B82Y 10/00 257/24 |
| 2014/0322921 A1 * | 10/2014 | Ahmad | | H05B 6/80 438/780 |
| 2014/0353802 A1 * | 12/2014 | Licausi | | H01L 21/314 257/622 |
| 2015/0170926 A1 * | 6/2015 | Michalak | | H01L 23/5329 257/734 |
| 2015/0171029 A1 * | 6/2015 | Michalak | | H01L 21/02282 257/773 |

* cited by examiner

METHOD AND APPARATUS FOR MICROWAVE TREATMENT OF DIELECTRIC FILMS

CROSS REFERENCE TO RELATED APPLICATIONS

This application claims the benefit of Provisional Application Ser. No. 61/854,556, filed Apr. 26, 2013 by the present inventor, the entire disclosure of which is incorporated herein by reference. The application is further related to the following utility applications, all filed on even date herewith: Method and Apparatus for Microwave Treatment of Dielectric Films, U.S. patent application Ser. No. 14/120,011, and Method and Apparatus for Microwave Treatment of Dielectric Films, U.S. patent application Ser. No. 14/120,010, the entire disclosures of which are incorporated herein by reference.

BACKGROUND OF THE INVENTION

1. Field of the Invention

The invention pertains to apparatus and method for tailored microwave heat treatment of low dielectric constant (k) organo-silicate glass (OSG) films deposited on substrates for semiconductor devices. More particularly, the invention pertains to burnout of post porosity plasma protection materials (e.g. PMMA and its variants) stuffed into the pores.

2. Description of Related Art

As integrated circuit feature sizes continue to shrink, new low dielectric constant (low-k) materials are needed to address problems with power consumption, signal propagation delays, and crosstalk between interconnects. One avenue to low-k dielectric films is the introduction of nanometer scale pores to lower the effective dielectric constant, which can therefore replace the dense silicon oxide insulator materials. Various materials and methods have been explored for deposition of porous organo-silicate glass (OSG) low-k films during the last 10-15 years. OSG materials have a silica-like backbone structure with a fraction of the Si—O bonds replaced with organic groups such as —$CH_3$. This reduces overall dielectric constant of the material.

The relative dielectric constant of dense OSG is limited to k values greater than ~2.7. It is expected that materials with even lower dielectric constants are needed for future generations of integrated circuits. To this end, a new class of OSG materials with porous structures introduced into the dense matrix has been successfully synthesized with k values as low as 2.0, which could be considered as leading candidates for use as interconnection dielectrics in emerging technologies.

The porous OSG films can be prepared by using a self-assembled technology to form nano-composite structures with controlled structure and physical properties. The spin-on low-k films are formed by condensing a hydrolyzed alkylated silica sol in the presence of a polymeric surfactant. This surfactant acts as a template to produce a regular porous structure as the film dries. Upon heat treatment the surfactant acts as a porogen and evaporates, thereby leaving behind a porous silica network with alkyl groups (e.g. methyl —$CH_3$), which passivate the internal and external film surfaces.

The spin-on porous dielectric films have compositions similar to the popular plasma-enhanced chemical vapor deposition (PECVD) film materials. For the PECVD approach, a sacrificial porogen is added to the gaseous mix, which on heat treatment or processing is removed from the film and thus the pores are formed within the film. The porogen loading can be changed to alter the film porosity in the range of 7-45%. The heat treatment is usually performed at ~400° C. or higher to completely remove the porogen, minimize the dielectric value k and simultaneously enhance the mechanical strength of the film.

However, successful implementation of these porous dielectrics structures poses numerous challenges. As compared to their dense counterparts, porous dielectrics are expected to have reduced cohesive strength and poorer adhesion with adjacent layers. They are more prone to the absorption of reactive chemicals during device fabrication, so much so that water can diffuse quite effectively into film stacks containing dielectric layer, even though the dielectric materials are usually hydrophobic. The moisture uptake could vary from ~0.54 wt. % to 1.7 wt. % as the porosity is raised to 40 vol. %. The ingress of water into the dielectric negatively impacts both the mechanical integrity as well as electrical performance of the devices. Some isotope tracer diffusion and secondary ion mass spectroscopy experiments have revealed that water diffuses predominantly along the interface and not through the porous films. This result was attributed to the hydrophobic nature of the dielectric material and the hydrophilic character of the interfaces—hence the degradation of the interfacial adhesion.

Another challenge for these porous OSG low-k dielectrics is that they are susceptible to damage induced during etching and cleaning process, which degrades the dielectric and electrical properties and surface roughness. The plasma exposure breaks the weakly bonded organic terminal groups from the silica backbone while simultaneously densifying the porous silica-like damaged skin layer. Much effort is being dedicated, in the first place, to minimize the plasma damage. As a second choice, post-patterning remedies intended for dielectric restoration are being explored as well. Usually, trialkyl-substituted disilazanes or chlorosilanes such as hexamethyl-disilane (HMDS) and trimethylchlorosilane (TMCS) or dimethylaminotrimethylsilane (DMATMS) and so on, are in use for dielectric restoration.

An approach to avoid this post porosity plasma or other processing (etching, chemical mechanical polishing) damage is to use a protective organic polymeric material (e.g. PMMA and its variants) which is temporarily stuffed into the pores. This approach strengthens the porous film to allow performing subsequent processes without damage. However, after the plasma processes have been performed this temporary material has to be removed or burnt out to recreate the pores and have a low k dielectric film.

OBJECTS AND ADVANTAGES

Objects of the present invention include the following: providing a system for infiltrating a porous film with a solvent immediately before microwave processing; providing a system for in-situ heating of a solvent-containing porous film using microwave energy; providing an apparatus for delivering controlled amounts of polar solvents to porous dielectric films or soft baked polymeric films to enhance the coupling with microwaves and enhance the reaction in the film material; providing a method to uniformly heat treat solvent-containing films deposited on substrates for selected applications; and, providing a method for reducing the thermal budget for processing low-k dielectric films. These and other objects and advantages of the invention will become apparent from consideration of the following specification, read in conjunction with the drawings.

SUMMARY OF THE INVENTION

According to one aspect of the invention, a method for processing a stuffed dielectric film on a substrate comprises the steps of:

receiving a workpiece, comprising a substrate and a porous dielectric film in which the porosity contains a polymeric stuffing material;

placing the workpiece in a microwave applicator cavity and heating it to a first selected temperature to at least partially burn out the polymeric material;

introducing a controlled amount of a selected polar solvent into the porosity created by the partial burn out;

applying microwave energy to heat the workpiece to a second selected temperature, below the first temperature and below the boiling point of the polar solvent to clean away the remaining polymeric material, wherein the cleaning process is enhanced by the interaction of microwave energy with the polar solvent; and, further applying microwave energy to heat the workpiece to a third selected temperature above the boiling point of the polar solvent to completely burnout any residues of the polymeric material.

According to another aspect of the invention, a method for processing a dielectric film on a substrate comprises the steps of:

depositing a porous dielectric film on a selected substrate;

stuffing the porosity of the porous film with a protective polymeric material;

performing at least one intermediate processing step on the stuffed dielectric film;

placing the film in a microwave applicator cavity and heating the film to a first selected temperature to at least partially burn out the polymeric material;

introducing a controlled amount of a selected polar solvent into the porosity created by the partial burn out;

applying microwave energy to heat the film to a second selected temperature below the boiling point of the polar solvent to clean away the remaining polymeric material, wherein the cleaning process is enhanced by the interaction of microwave energy with the polar solvent; and, further applying microwave energy to heat the workpiece to a third selected temperature above the boiling point of the polar solvent to completely burnout any residues of the polymeric material.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting embodiments illustrated in the drawing figures, wherein like numerals (if they occur in more than one view) designate the same elements. The features in the drawings are not necessarily drawn to scale.

DETAILED DESCRIPTION OF THE INVENTION

Figure 1:
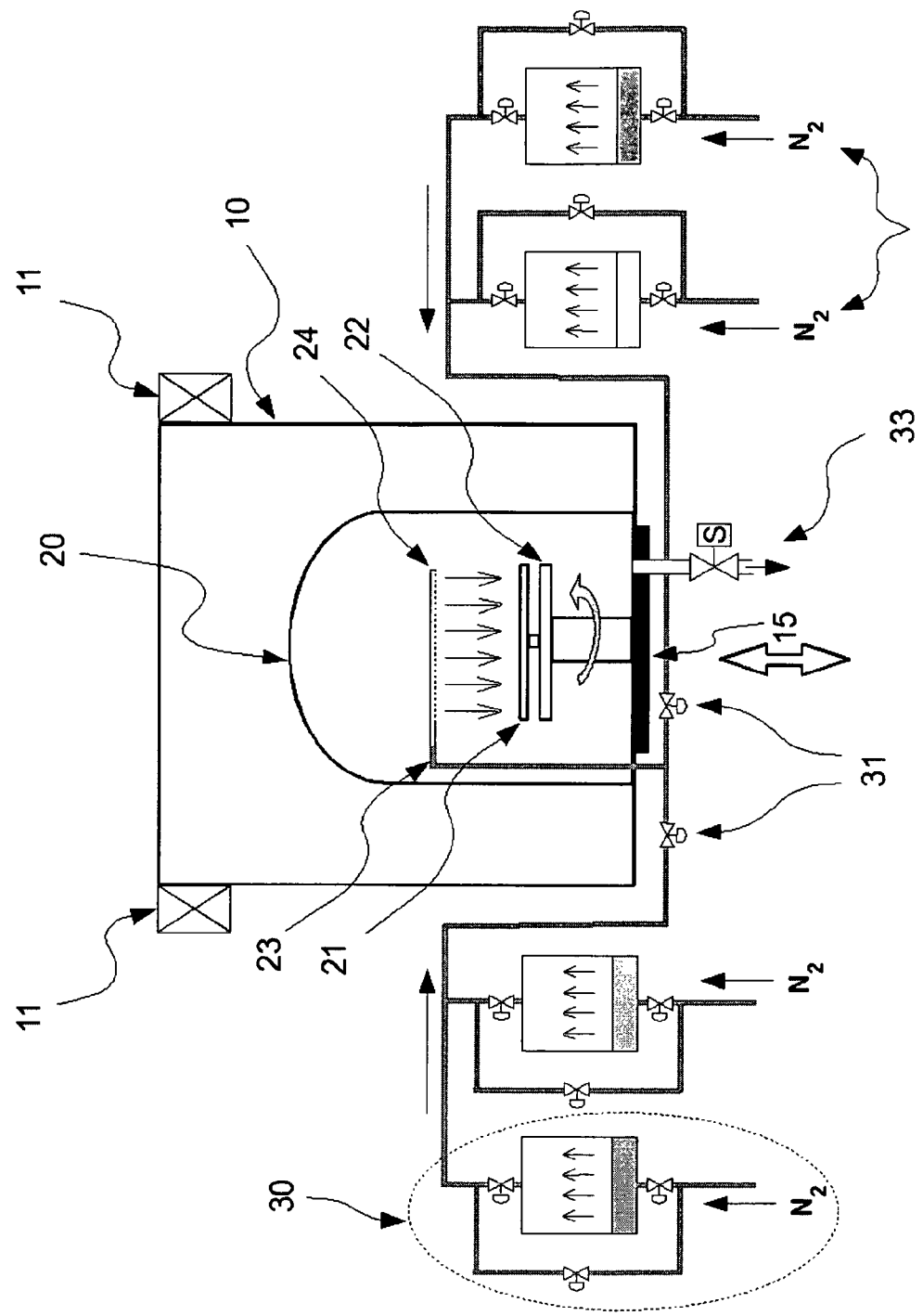
FIG. 1 illustrates schematically an apparatus that will allow solvent or reagent vapors from a single or multiple sources delivered on to a porous film and in-situ microwave heat treatment of the dielectric film on the substrate.

Microwave energy because of its rapid and internal heating mechanism has been one of the very attractive means of heat treatment. For curing processes microwaves interact with polar groups of molecules in the organic materials, enhance their mobility because of the rotation movement of molecules and hence enhance the cross-linking of monomers or cure of materials. In other semiconductor materials or coatings, the microwave induced transport of current carriers and possible polarization, the anneal processes can be performed in shorter times or at somewhat lower temperatures.

Microwave energy is especially beneficial for porous materials, because unlike any other heating technology, it has the ability to interact with the polar molecules in the pores of the material and rotate and agitate these polar molecules. Since these porous films are more prone to the absorption of reactive chemicals, we use it to our advantage. The key is to first intentionally infiltrate polar (vapor) molecules into the pores. Then apply microwave energy to interact with the infiltrated polar molecules to enhance the desired process, by enhancing the mobility of the species taking part in the reaction. This understanding and its use constitutes an important aspect of this invention.

The use of microwave energy could be effectively employed for the porogen removal process by first infiltrating polar solvent into the pores, followed by microwave exposure to rotate or agitate the polar solvent molecules within the pores, which will assist in the porogen removal.

Before the subsequent processes where the pores (and therefore the film) could be damaged, the pores are temporarily stuffed with protective organic polymeric materials (e.g. PMMA and its variants). This strengthens the porous film and the plasma or other processing (etching, chemical mechanical polishing) can be performed without causing damage. The same approach can be used to remove this temporary material. A VFM heating process can burn out some material from the pores. Then infiltrating a polar solvent into the pores and exposing it to VFM will cause rotation of the polar solvent molecule in the pores. This will dissolve the material and if necessary repeated cycles can completely remove the material that was used to stuff the pores, thereby recreating the pores.

The above approach of pore stuffing is to prevent the physical damage to the porous films structure. Even if the physical damage is prevented, during the plasma exposure there could be surface damage or modification, such as breaking of the weakly bonded organic terminal groups from the silica back bone.

Microwave treatment can also be used for restoration of the surface from damage caused by plasma contact during etching and cleaning processes. One of the chemicals hexamethyldisilane (HMDS) generally useful for conditioning chromatography columns and deactivating glassware is also used for plasma damage restoration and is a very popular chemical reagent for enhancing synthesis reaction with microwaves. Therefore, HMDS vapors can be infiltrated into the pores of the dielectric material and followed by microwave exposure. Any polar groups or molecule within the pores of the dielectric will be set into rotation thereby providing agitation of HMDS molecules to assist in the restoration of the entire silica surface area damaged with plasma processes. Anywhere these molecules can infiltrate microwave has the ability to agitate them deep within the pores and assist in enhancing the reaction. Similar mechanisms will be in play for other reagents TMCS or DMATMS and so on, listed above. Variable Frequency Microwave (VFM) is well suited for processing semiconductor materials and thin film coatings used for numerous electronics, semiconductor wafers, flat panel displays and photovoltaic applications. The basic VFM approach is well-known and taught in at least the following U.S. Patents, each of which is incorporated herein by reference in its entirety: U.S. Pat. Nos. 5,321,222; 5,721,286; 5,961,871; 5,521,360; 5,648,038; 5,738,915, 7,939,456, and 8,021,898. In particular, the continuous sweeping of frequencies over the available bandwidth, as taught in the aforementioned references, reduces the potential for arcing and subsequent damage. Frequency sweeping is often carried out by selecting a center frequency and then rapidly sweeping the frequency in a substantially continuous way over some range (typically +/−5% of the center frequency, although this range can vary depending on such factors as the type of microwave source, and the overall size of the cavity compared to the microwave wavelength). Numerous kinds of wafers with integrated circuits have been exposed to VFM and it has been demonstrated that there is no damage to the circuits or their functionality. The use of VFM provides more rapid processing as compared to conventional heat treating furnaces.

As noted earlier, one objective of the invention is to provide uniform and rapid microwave heat treatment of thin dielectric films on large substrates, especially those with metallization that cannot be easily processed with single frequency microwave because of the potential for charge build, leading to arcing and hence damaging the electronic devices or circuits. However, on smaller substrates, especially those with simple organic coatings and little or no metallic traces, single frequency microwaves applies equally well and are thus not excluded from this invention. Therefore, microwaves have been frequently used in this invention and where ever necessary, the preferred Variable Frequency Microwaves (VFM) sources could be used on the equipment instead of fixed frequency microwave sources.

It is instructive to review the general dynamics of polar molecules when exposed to microwave energy. As we already know, while heating food with microwaves the polar water molecule is set into rotation. With all the rotating water molecules adjacent to each other and the friction between these molecules, food is rapidly heated with the penetrating microwave energy. However, with stoves and convection ovens, heat has to be conducted through water and the water molecule will simply have linear translational movement. When water is at higher temperatures the atoms in the molecule will have the linear translational movement regardless of the heating method (including microwaves). However, during microwave exposure there is the additional rotational movement of the polar water molecule. The same applies to numerous other polar groups or molecules in any solvent, reagent or reactant, which have densities close to that of water.

One goal of the invention is to incorporate the solvent or reagent vapor or liquid by infiltration into a film in a carefully controlled manner just prior to microwave treatment, so that while the polar vapor or reactant molecules are still available within the pore volume, microwaves will interact with these polar groups or molecules and enhance their mobility and therefore enhance the reaction. The same reaction is expected with higher temperature (by other heating means) but only due to the linear translational movement introduced at those temperatures. With microwave heating at the same temperature, the linear translational movement is still there, however the additional rotational movement of the polar molecules is what enhances the reaction, which in this case is right within the pore volume. During the microwave heating process the solvent or reagent will be depleted. In some cases, it may be advantageous to let the sample cool, which will be much faster since microwave heating is a cold wall process, evacuate the chamber, deliver more polar material into the chamber so that fresh liquid or vapors will infiltrate into the pores, and repeat the microwave heating process. Thus the infiltration and microwave heating could be alternately cycled to allow maximum extent of the reaction desired.

Table I lists some non-polar solvents, which have very small dipole moments as well as dielectric constants. The non-polar solvent molecules will not respond well to microwaves.

TABLE I

Properties of some non-polar solvents

| Non-polar Solvents | Chemical Formula | Dielectric Constant | Dipole Moment | Boiling Point, °C. |
|---|---|---|---|---|
| Pentane | $CH_3-CH_2-CH_2-CH_2-CH_3$ | 1.84 | 0.00 D | 36 |
| Cyclopentane | $C_5H_{10}$ | 1.97 | 0.00 D | 40 |
| Hexane | $CH_3-CH_2-CH_2-CH_2-CH_2-CH_3$ | 1.88 | 0.00 D | 69 |
| Cyclohexane | $C_6H_{12}$ | 2.02 | 0.00 D | 81 |
| Benzene | $C_6H_6$ | 2.3 | 0.00 D | 80 |
| Toluene | $C_6H_5-CH_3$ | 2.38 | 0.36 D | 111 |
| 1,4-Dioxane | /—$CH_2$—$CH_2$—O—$CH_2$—$CH_2$—O—\ | 2.3 | 0.45 D | 101 |
| Chloroform | $CHCl_3$ | 4.81 | 1.04 D | 61 |
| Diethyl ether | $CH_3CH_2-O-CH_2-CH_3$ | 4.3 | 1.15 D | 35 |

In contrast, the polar solvents listed in Table II have significantly higher dielectric constants and dipole moments. Like the water molecules, in presence of microwave energy these polar molecules will be set into rotational movement (possible in available space). Anywhere the vapors of these solvents can deposit, even deep into the pores of the porous dielectric film, microwave energy has the capability to agitate these molecules and stir up the reaction. It will be preferred to stay below the boiling point of the solvent or reagent to allow some additional rotational movement within the pores before going to higher process temperature.

TABLE II

Properties of some polar solvents

| Polar Solvents | Chemical Formula | Dielectric Constant | Dipole Moment | Boiling Point, °C. |
|---|---|---|---|---|
| Water | H—O—H | 80 | 1.85 D | 100 |
| Ethanol | $CH_3$—$CH_2$—OH | 24.5 | 1.69 D | 79 |
| Methanol | $CH_3$—OH | 33 | 1.70 D | 65 |
| Isopropanol (IPA) | $CH_3$—CH(—OH)—$CH_3$ | 18 | 1.66 D | 82 |
| Acetic acid | $CH_3$—C(=O)OH | 6.2 | 1.74 D | 118 |
| Acetone | $CH_3$—C(=O)—$CH_3$ | 21 | 2.88 D | 56 |
| n-Propanol | $CH_3$—$CH_2$—$CH_2$—OH | 20 | 1.68 D | 97 |
| n-Butanol | $CH_3$—$CH_2$—$CH_2$—$CH_2$—OH | 18 | 1.63 D | 118 |
| Formic acid | H—C(=O)OH | 58 | 1.41 D | 101 |
| Propylene carbonate | $C_4H_6O_3$ | 64.0 | 4.9 D | 240 |
| Ethyl acetate | $CH_3$—C(=O)—O—$CH_2$—$CH_3$ | 6.02 | 1.78 D | 77 |
| Dimethyl sulfoxide | $CH_3$—S(=O)—$CH_3$ | 46.7 | 3.96 D | 189 |
| Acetonitrile (MeCN) | $CH_3$—C≡N | 37.5 | 3.92 D | 82 |
| Dimethylformamide | H—C(=O)N$(CH_3)_2$ | 38 | 3.82 D | 153 |
| Tetrahydrofuran | /—$CH_2$—$CH_2$—O—$CH_2$—$CH_2$—\ | 7.5 | 1.75 D | 66 |
| Dichloromethane | $CH_2Cl_2$ | 9.1 | 1.60 D | 40 |

FIG. 1 illustrates the schematic details of a microwave apparatus that will allow infiltration of the solvent or reagent into the porous dielectric film and in-situ microwave treatment of film on substrates, performing the method disclosed in this invention. The apparatus consists of a microwave chamber 10, powered by single or multiple microwave sources 11. The substrates with porous dielectric film can be loaded into the chamber by lowering a platform 15 mounted on an elevator (not shown), like many of the state of art batch wafer chambers. Within the microwave chamber is a quartz bell jar 20, into which the solvents or vapors to be infiltrated are delivered. The substrate 21 is placed on a dielectric/susceptor/cooling stage assembly 22 (with vacuum suction) and rotated slowly to evenly distribute the vapors over the film on the substrates. The dielectric assembly or cooling stage 22 may include a conventional lift pin mechanism as commonly used in the industry.

The vapors of the solvent or reagents to be infiltrated into the porous film can be brought into the chamber through the tubing 23 and delivered on the substrate by the shower head, atomizer, diffuser, or other spray mechanism 24. It may be desirable to have just enough fluid dispensed from the shower head to form a thin liquid layer on the porous dielectric film to allow the fluid to fill the pores. With more fluid in the pore contacting the entire inner surface of the pore the rotation of the polar molecules will perform the removal process more efficiently. Depending on the application, one might use a single polar material source 30 or a bank of sources containing different materials controlled and adjusted through control valves 31. Since multiple sources of vapors can be used with this technique, the temperature of each of these sources of vapors could be adjusted to get to the temperature for appropriate vapor pressure. An inert carrier gas 32 carries the vapors to shower head 24 in the quartz bell jar 20. Although the inert gas shown in the FIG. 1 is $N_2$, others inert gases (argon, $H_2$, and forming gas) could be used as well.

A vacuum pump 33 can be used to evacuate the chamber to remove the effluents or gaseous by-products. The vacuum pump and intake vapor feed could be adjusted to maintain any desired vapor pressure for the process. Preferably, pumping will not be continued during the microwave heat treatment, because at low pressures (<100 Torr) there is the possibility of generating plasma. Microwave plasma processing is performed routinely and can be performed here as well, for example for cleaning of the chamber but it is not the main emphasis of this invention. What is important is the application of microwaves to a coated substrate having a carefully controlled amount of a polar solvent that will interact with the applied microwave power.

Figure 2:
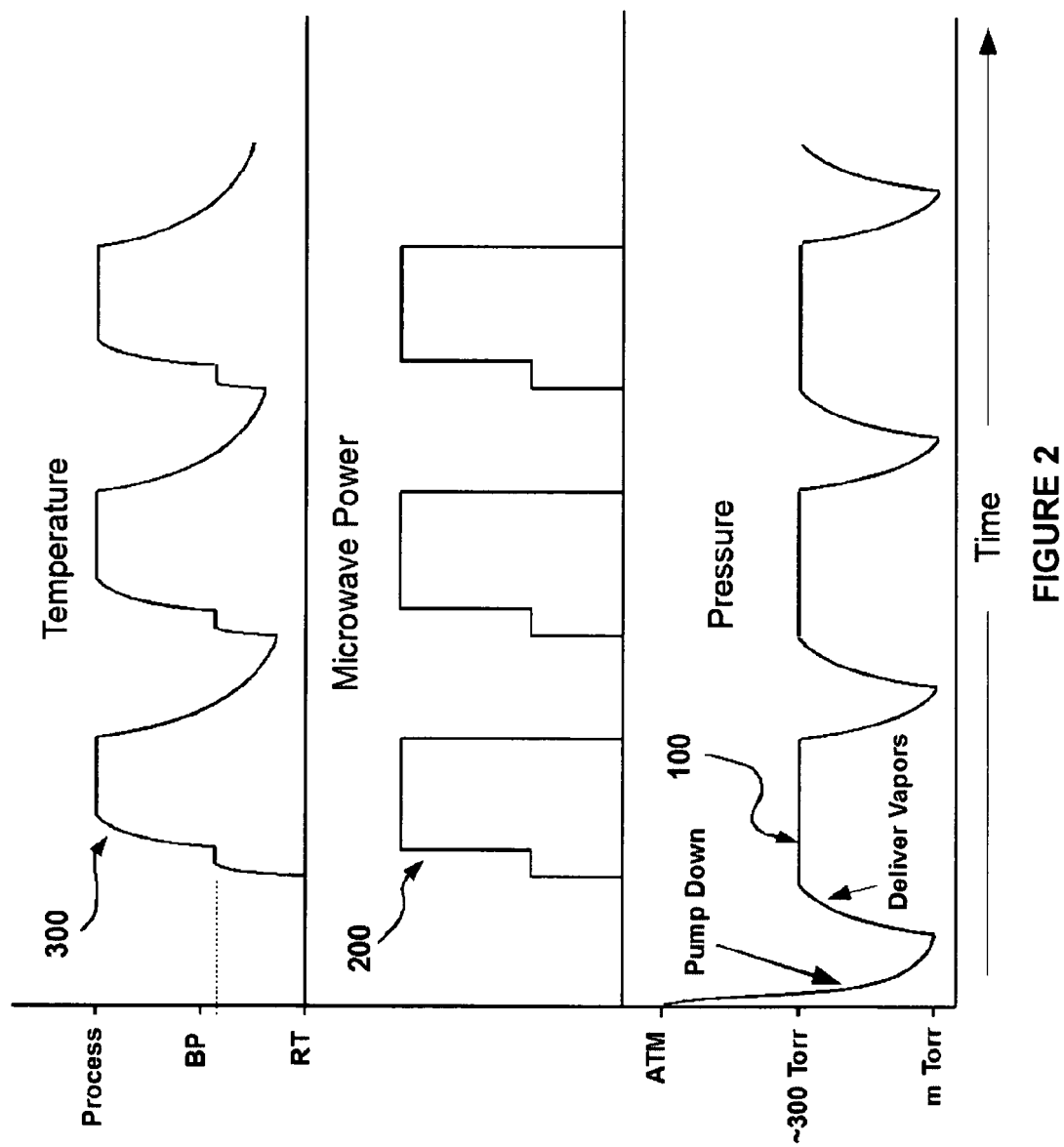
FIG. 2 illustrates the schematic of variation in pressure, application of microwave and the temperature rise as well as the cyclic nature possible with microwaves heating.

FIG. 2 illustrates the schematically how the pressure, vapor infiltration, microwave power and temperature cycling dynamics might be carried out for the case where a workpiece is subjected to multiple cycles of infiltration and heat treatment in order to achieve a desired amount of processing. After the substrate with porous dielectric film has been placed in the chamber, FIG. 1, on stage 22 and the system door 15 has been closed, the first step is to evacuate the bell jar 20 down to mTorr range to draw the air out of the pores in the porous dielectric film. This is shown as pressure and vacuum pump down 100 in FIG. 2. At this point, the appropriate vapors of the solvent or reagent can be delivered into the quartz chamber and allow the pressure to climb up to few hundred (>200) Torr so that there is no chance of generating a plasma when microwave power is introduced. At this pressure, the pores evacuated down to mTorr range will be infiltrated with the solvent or reagent vapors. Now, it is time to turn microwave power on (shown as 200 in FIG. 2) and let microwaves interact and rotates the polar molecules of the solvent deep in the pores of the porous dielectric film. These rotating agitators can assist in enhancing the desired process. It would be preferred that the temperature (shown as 300 in FIG. 2) of the substrate is maintained for a selected time (e.g., 2-3 minutes) below the boiling point of the solvent to avoid removing the solvent so rapidly that it won't have time to promote or enhance the desired reaction. The temperature can then be increased to the final process temperature and held for a second time, e.g., ~5-10 minutes, when the microwave power can be turned off and the substrate can be allowed to cool to a temperature lower than the boiling point of the solvent. The entire cycle can be repeated again by evacuating the chamber and the pores, infiltrating them with fresh solvent or reagent and continue the polar molecule agitation within the pores followed with the high temperature heat treatment. Since everything in the chamber is cool except the substrate and the porous film this cyclic process is easily possible with microwave and it is only microwaves that can selectively provide the agitation of the polar molecules within the pores.

It will be understood that if liquid solvent is dispensed from a shower head, atomizer, or the like, the pressure in the chamber will generally be ambient pressure as opposed to a reduced pressure or partial vacuum.

The two primary processes addressed in this invention that can be conducted by the above method and apparatus are now described in more detail.

Solvent Infiltration and Porogen Removal:

The preparation of porous OSG films with PECVD and spin-on self-assembled technology to form nano-composite structures was briefly discussed above in the BACKGROUND section. PECVD has been a popular approach for many processes in the semiconductor manufacturing and has been useful for depositing films with a higher dielectric constant. For low-k films, a sacrificial porogen is added into the gas stream which on heat treatment is removed from the film and thus the pores are formed within the film. However, PECVD films are not able to satisfy all the requirements because of the uncontrollable process of pore formation and some porogen residues left during cure that increase the leakage current and decrease the breakdown voltage.

The spin-on films with self-assembled porous structures are under investigation and the advantage of these porous structures are that they are formed without the use of a sacrificial porogen so there is no risk of residues during cure. These low-k films are formed by condensing a hydrolyzed alkylated silica sol in the presence of a polymeric surfactant. This surfactant acts as a template to produce a regular porous structure as the film dries. However, a cure process is still necessary so that the surfactant which acts as a porogen is completely eliminated, thereby leaving behind a porous silica network with alkyl groups (e.g. methyl —$CH_3$), which can passivate the internal pore and external film surfaces.

The cure process can be conducted using UV, conventional thermal oven, or microwave energy. The surfactants are generally soluble in water or solvents, so one aspect of this invention is to infiltrate water or solvent into the pores of the film and expose the film on the substrate to microwaves. This exposure of microwaves to the nano-scale polar water or solvent molecules within the pore of the film will make them act as nano-agitators and during the rotation or spinning movement within the pores will assist in surfactant or porogen removal from the surface of the pores.

The description and data from such experiments on the spin-on dielectric films infiltrated to solvent and then exposed to microwaves is given below in the Examples.

Restoration of Plasma Damaged Surface:

The other issue to be resolved with these dielectric films is the restoration of the surface damage caused by the use of plasma for etching and cleaning purposes.

During the semiconductor device fabrication processes there are numerous etching/ashing/cleaning plasma processes. Due to the weak strength the porous low-k dielectrics are susceptible to plasma damage. The plasma exposure breaks the weakly bonded organic terminal groups from the silica back bone and simultaneously densifies the porous medium further to form a silica-like damaged skin layer. This damage and aggravated surface roughness degrades the dielectric and electrical properties of the devices.

For restoring this damage a variety of materials are being explored which include but are not limited to trialkyl-substituted disilazanes or chlorosilanes such as hexamethyldisilane (HMDS) and trimethylchlorosilane (TMCS) or dimethylaminotrimethylsilane (DMATMS), phenyldimethylchlorosilane PDMCS, diphenyltetramethyldisilazane DPTMDS and so on. HMDS is generally useful for conditioning chromatography columns and for deactivating glassware or silica surface. For plasma damage restoration process HMDS will restore the pore surface by replacing the hydroxyl (—OH) group with methyl (—$CH_3$) group according to the following reaction.

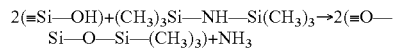

As described above, HMDS is very popular chemical reagent for enhancing synthesis reaction with microwaves. Thus one aspect of this invention is to infiltrate HMDS into the pores of the dielectric material and expose it to microwave energy. Any polar groups (—OH) or molecules within the pores of the dielectric will be set into rotation thereby providing agitation of HMDS molecules to assist in the restoration of the entire silica surface area damaged with plasma processes. The only reaction byproduct is ammonia, which happens to be a polar molecule, too. Thus the polar ammonia molecules will also be set into rotation thereby providing even more agitation of remaining HMDS molecules to assist in the restoration of the entire surface area damaged with plasma processes. Anywhere these molecules can infiltrate microwave has the ability to agitate them deep within the pores and assist in enhancing the reaction. It would be advantageous to stay below the boiling point (125° C.) of HMDS so that it does not evaporate immediately and has the sufficient interaction with the pore surface before going higher in temperature as shown in FIG. 2 to densify and strengthen the surface restored so far. The substrate can then be allowed to cool down to below the boiling point of HMDS and another cycle be performed to increase the extent of restoration. This process can be continued for a number of cycles to make sure restoration is complete. Although only the details for HMDS have been described, similar mechanisms will be in play for other reagents TMCS or DMATMS and so on, listed above.

Following are a few examples that illustrate the benefit that provide the basis for this invention.

Example

Cure and Porogen Removal of Low-k Dielectric Films

Various materials and methods have been explored for deposition of porous organo-silicate glass (OSG) low-k films during the last 10-15 years. Spin-on materials with self-assembled porous structures have also been investigated. Like many dielectrics, these films are soft baked at 150° C. for 2 minutes and are then finally cured at 450° C. for 30 minutes. These spin-on films have been cured with VFM under various conditions and the data are presented in Table III. In runs 1-3 no solvent was used to infiltrate the pores of the porous dielectric film, whereas water was used for run 4 and ethanol for run 5. For each case the Refractive Index (RI), Hardness (H) and Young's Modulus (E) were measured after the VFM process, Table III.

TABLE III

Microwave process results with and without added solvents

| Run | Solvent | T, ° C. | Time, min. | Refractive Index | Hardness H (GPa) | Young's Modulus E (GPa) |
| --- | --- | --- | --- | --- | --- | --- |
| 1. VFM | N/A | 350 | 30 | 1.246 | 0.42 | 3.88 |
| 2. VFM | N/A | 400 | 25 | 1.248 | 0.47 | 4.36 |
| 3. VFM | N/A | 400 | 15 | 1.255 | 0.42 | 3.86 |
| 4. VFM + Solvent | Water | 400 | 10 | 1.251 | 0.43 | 3.91 |
| 5. VFM + Solvent | Ethanol | 400 | 10 | 1.245 | 0.45 | 4.04 |

Comparing runs 3, 4, and 5 shows a very striking result. Run 3 applied VFM heating only, without the use of any solvent before the final heat treatment at 400° C. for 15 minutes. Samples for run 4 and 5 had been infiltrated with water and ethanol, respectively, by briefly dipping them in the liquid solvents immediately before the final 400° C. VFM heat treatment. As shown in FIG. 2, the first heating step is below the boiling point of the solvent so for run 4 where water (B.P.=100° C.) was used, the sample was heated to 90° C. for 2 minutes before going to 400° C. where it was heated for 10 minutes. For run 5 where ethanol was used (B.P.=78° C.) the sample was heated to 65° C. for 2 minutes and then followed with 10 minutes at 400° C. For the data presented there was only one exposure to the solvent followed by the higher temperature (400° C.) heat treatment.

Comparing the data for runs 3 and 4 one observes that even though the run 3 had 15 minutes at 400° C., the refractive index for run 4 (water, 400° C., 10 min) is lower (lower the better), while both H and E are higher. For run 5 (ethanol, 400° C., 10 min) RI was even lower and H and E are even higher. Note that the time for (solvent) runs 4 and 5 is 10 minutes as compared to 15 minutes for run 3 (no solvent).

It is important to note that the result of this experiment is counter-intuitive. Recalling that the as-made film had been soft-baked to remove most or all of the solvent, one would expect that by adding some solvent back into the coating, the following heat treatment might in fact take longer because of the need to remove that added solvent. Applicants have found, instead, that the added solvent has enhanced the effectiveness of the microwave process and thereby actually reduced the overall thermal budget while achieving comparable results.

In the foregoing experiments, the solvent was applied simply by dipping the film in liquid solvent and removing excess liquid before heat treatment. It will be understood that various means of adding controlled amounts of solvent may be used within the spirit of the invention. A shower head, spray nozzle, mister, atomizer, or vapor source contained within the microwave cavity as shown schematically in FIG. 1 may be convenient for some applications, particularly where various mixtures or combinations of solvents might be needed, and also where multiple cycles are anticipated. Alternatively, the soft baked coating may be held in a controlled humidity or partial pressure of the selected polar solvent and then transferred to the microwave cavity for immediate processing as described in the following example. This approach might be particularly useful when a single heat treatment is needed along with very precise level of control of the amount of solvent introduced.

Example

Figure 3:
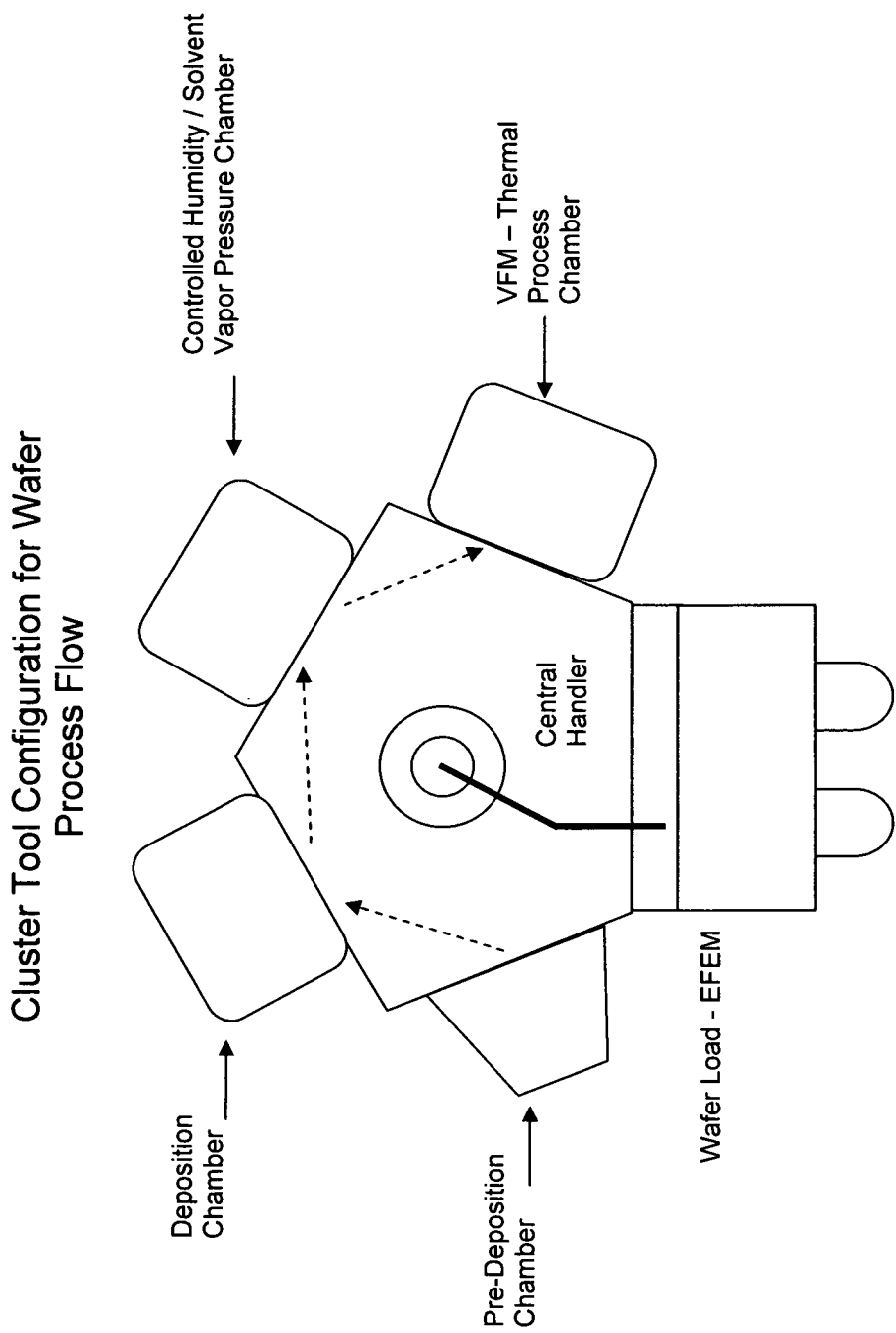
FIG. 3 illustrates schematically another example of the invention, configured in a cluster tool arrangement.

FIG. 3 shows one arrangement, in which one or more substrates, having soft baked coatings thereon, are held for a selected time to equilibrate in a chamber containing a fixed vapor pressure of the selected solvent. This approach may be conveniently incorporated into a cluster tool environment, in which a robotic handler adds one soft baked wafer to the humidity chamber and withdraws another and moves it to the microwave cavity for treatment. The size of the chamber can be selected to properly buffer the production rate of the line so that each wafer has a sufficient residence time in the chamber to equilibrate at the known partial pressure.

It will be appreciated that soft baking, followed by equilibration with solvent vapor at a lower temperature will be much more precise than trying to soft bake at a particular temperature to produce the target solvent concentration directly. It will be further appreciated that by using this approach, one could enjoy more process flexibility because a first solvent might be used to form the coating, whereas a second solvent may then be introduced after soft baking, with the second solvent being more desirable for a particular microwave treatment.

Example

There are several ways of establishing a known vapor pressure of solvent in a closed chamber. One could construct a humidistat that will automatically maintain a humidity value using a combination of a heated or cooled solvent tank and a humidity sensor. Alternatively, it is well known that various chemical mixtures can be used, which will have a fairly well-known equilibrium vapor pressure in the headspace over them. For example, saturated aqueous solutions of various salts, held at selected temperatures, may be used to generate a relative humidity from 9 to 99.7%; similarly, aqueous solutions of sulfuric acid may be used to produce a relative humidity ranging from 100% to as low as 3.2% depending on the strength of the acid solution [see, e.g., CRC Handbook of Chemistry and Physics, $60^{th}$ Edition, p. E-46 (1979)].

Example

The experimental results shown herein demonstrate that even with a single exposure to solvent the film properties improved over the VFM heating alone, demonstrating the advantage of being able to agitate the polar molecules within the pores of the porous dielectric film. As mentioned above, the dielectric films are generally hydrophobic in nature, still the polar molecules of water were able to improve final properties of the film. When ethanol is used as the solvent the properties improve even further. It will be appreciated that one could add more cycles to have multiple exposures to the solvent as shown in FIG. 2 if needed to achieve optimal properties in a particular application.

Multiple heating cycles may better ensure the mechanical properties of the porous dielectric film are robust enough to handle the subsequent semiconductor device fabrication processes. However, if there is some plasma damage occurring during the numerous etching/ashing/cleaning plasma processes, the following example illustrates how to repair that damage.

Example

Restoration of the Plasma Damaged Porous Dielectric Films

In the example above, the VFM agitation of the polar solvent molecules within the pores of the film was demonstrated to improve the film properties. Although these films can be formed with lower k values, successful implementation of these porous dielectrics structures poses numerous challenges including their susceptibility to damage induced during etching and cleaning process. Much effort is being dedicated to minimize the plasma damage in the first place, while post-patterning remedies for dielectric restoration are being considered as a second approach.

The first example demonstrated a process which has the potential to minimize the plasma damage whereas this example addresses the restoration of the plasma damage. HMDS is well known for conditioning and deactivating silica surface by replacing the hydroxyl (—OH) group with methyl (—$CH_3$) group according to the reaction shown above.

HMDS by itself has low polarity and does not interact very well with microwaves, yet it has been explored as a good reagent to speed up other microwave synthesis reactions. The purpose here is not to exploit its polarity but to use its capability to restore silica surfaces, infiltrate the vapors into the pores of the porous dielectric structure and use microwaves to speed up the reaction that it already is capable of performing by interacting with the polar hydroxyl (—OH) groups. The only reaction byproduct—ammonia, is also a polar molecule, and its agitation with microwave will assist the remaining HMDS molecules in the restoration of the entire surface area damaged with plasma processes. Since the boiling point is 125° C., the temperature should be maintained below that for about a few minutes or so to allow sufficient replacement of hydroxyl (—OH) groups with methyl (—$CH_3$) groups before going to higher temperatures as shown in FIG. 2 to densify and strengthen the surface restored. The substrate can then be allowed to cool down to below the boiling point of HMDS and another cycle be performed to increase the extent of restoration. This process can be continued for a number of cycles to make sure restoration is complete.

HMDS is used as an example but it will be appreciated that the invention extends to other reagents which include, but are not limited to, trialkyl-substituted disilazanes or chlorosilanes such as hexamethyldisilane (HMDS) and trimethylchlorosilane (TMCS) or dimethylaminotrimethylsilane (DMATMS), phenyldimethylchlorosilane PDMCS, diphenyltetramethyldisilazane DPTMDS and so on.

In addition to the foregoing processes, another important process used with low-k dielectrics is described as follows.

Removal of Post Porosity Plasma Protection Stuffing Materials:

After porogen removal a sacrificial organic polymer is introduced into the porous matrix to protect it during intermediate process steps, which might include patterning, etching, plasma processing, chemical mechanical planarization, plating, CVD coating, PECVD coating, spin-on coating, or other processes as are familiar in the art of semiconductor processing. A common material for so-called pore stuffing is PMMA. The molecular weight of PMMA is typically between 1000 and 7000 g/mol so that it provides an appropriate window for the filling conditions in the porous matrix. The sacrificial polymer PMMA is mixed in a solvent which also wets the low-k material's surface due to its low surface energy. The PMMA/solvent solution is then spin coated on top of the dielectric film followed by an anneal process which allows filling of the pores in the low-k dielectric film. The use of this temporary stuffing material (which does not suffer from shrinkage and material interaction) provides a promising approach to mitigate plasma damage, as taught in detail by Frot et al. in "Application of the Protection/Deprotection Strategy to the Science of Porous Materials," *Advanced Materials* XX: 1-5 (2011). After the plasma process of etching (or polishing etc.) has been performed the polymer has to be removed from the pores by a thermal burnout process above 400° C.

The alternative to the thermal burnout is to use microwave along with a solvent to dissolve and remove the material stuffed in the porosity. Since the common stuffing material is PMMA (or variants thereof) it would be preferable to use a solvent for PMMA. A mixture of ethanol and water has been reported to have better solubility of PMMA than either ethanol or water alone, so a mixture of the two was used for this aspect of the invention, the details of which are given in the example below.

Example

A porous dielectric film containing PMMA stuffed into the pores was placed in a vacuum capable microwave chamber and first pumped down to $5 \times 10^{-5}$ Torr at which point 500 sccm flow of $N_2$ was allowed, which brought the pressure up to $6 \times 10^{-2}$ Torr. Then microwave power was delivered into the chamber and the temperature was increased to soak temperatures of 330, 370 and 410° C. The purpose of this brief higher temperature step was to partially create the pores by partial burnout of PMMA.

Figure 4:
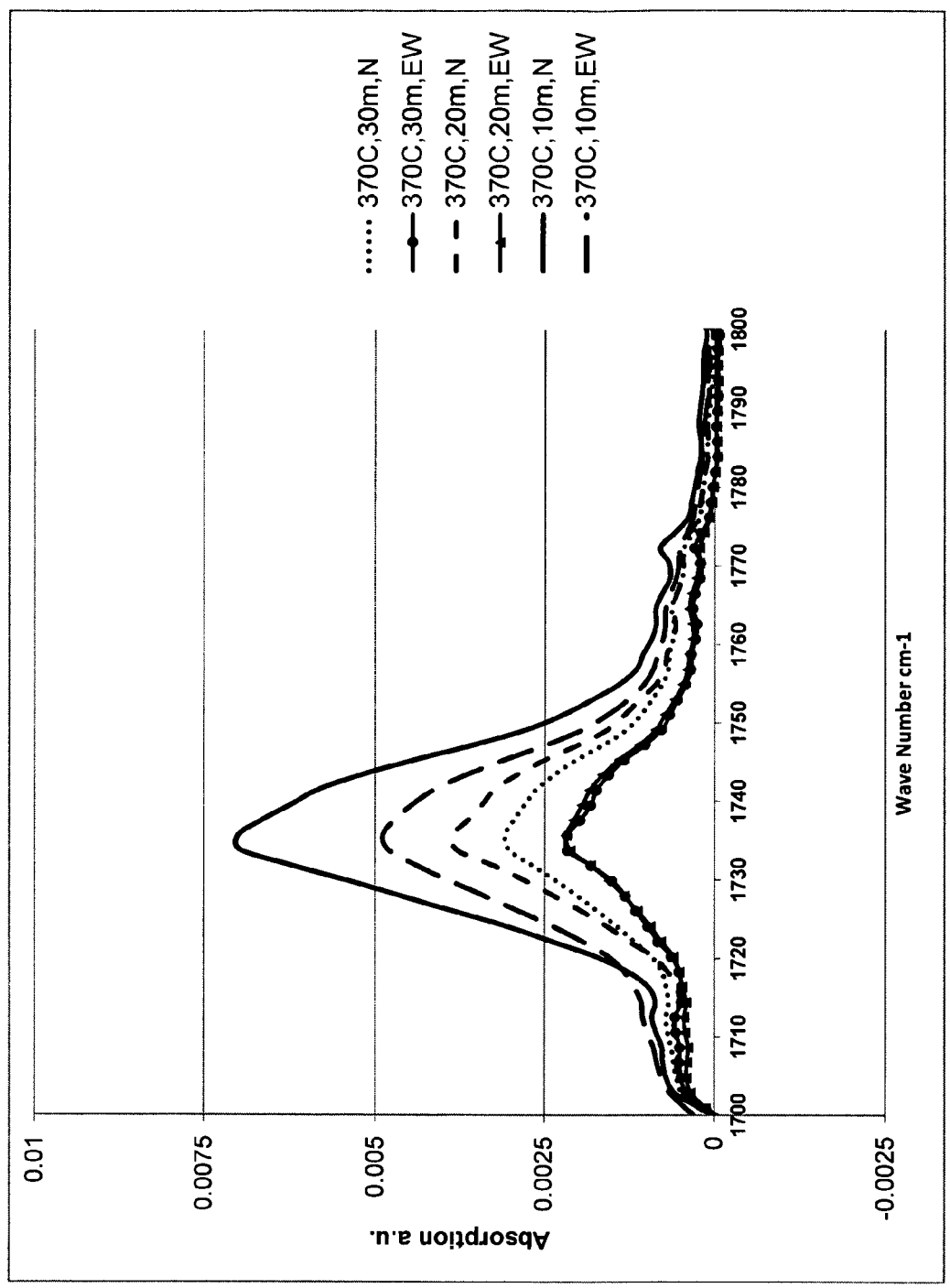
FIG. 4 is the FTIR plots showing the change of the peak intensity for C=O (in PMMA) around wavenumber 1735 $cm^{-1}$ as process time or conditions are varied.
Figure 5:
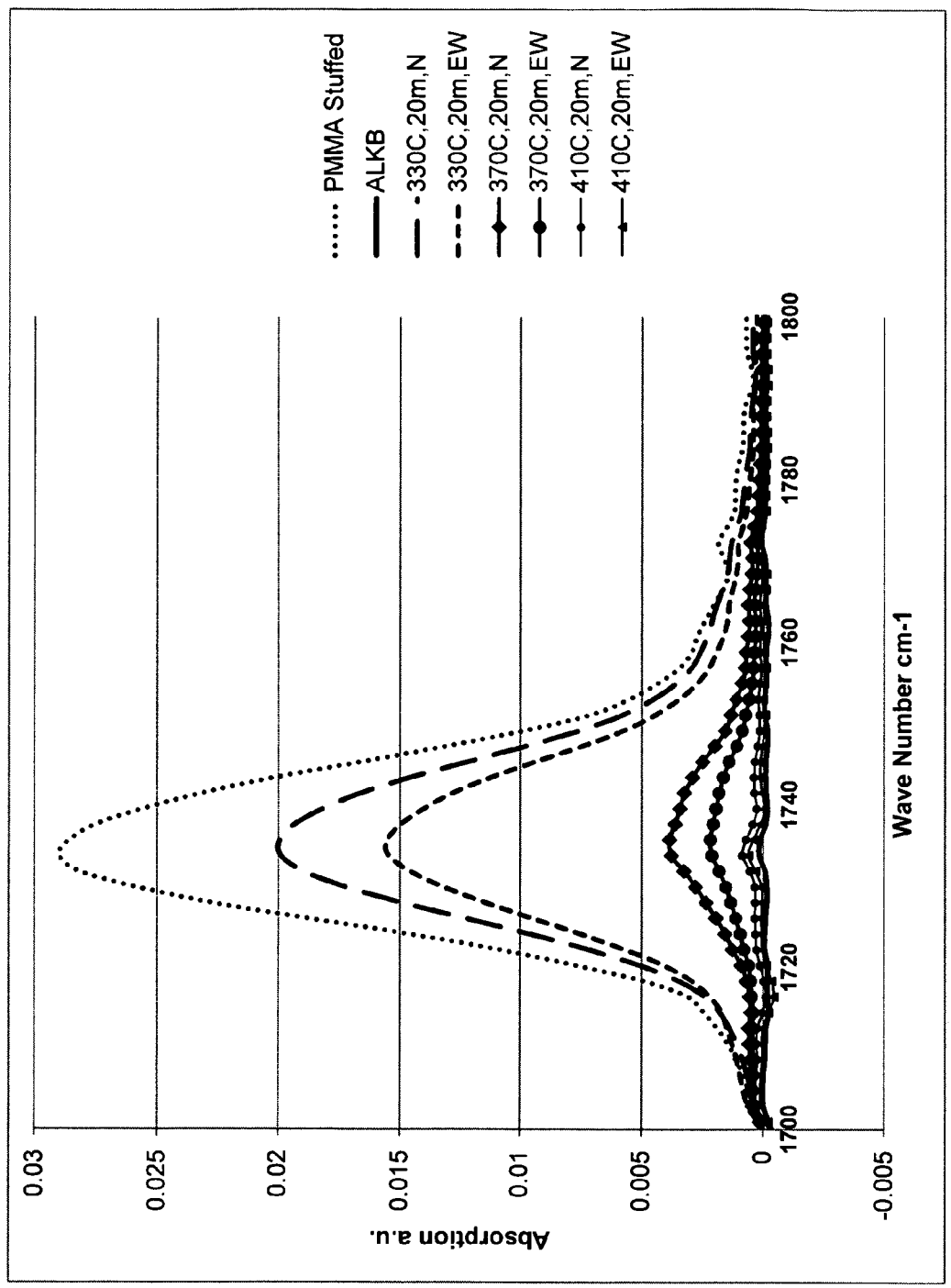
FIG. 5 is the FTIR plots showing the change of the peak intensity for C=O (in PMMA) around wavenumber 1735 $cm^{-1}$ as process temperature or conditions are varied.

The time (m=minutes) at temperature is half of what is shown in the data on FIGS. 4 and 5. The N and EW in FIGS. 4 and 5 stand for "No" conditioning and using "ethanol+water" mixture (E:W=60:40 by weight) as the solvent. The largest peak in FIG. 5 is for the dielectric film sample with PMMA still stuffed in it, while ALKB refers to the Pristine OSG film.

After the first exposure to microwave and half the soak time at high temperature, the sample was cooled to room temperature and immersed in the mixture of ethanol and water (EW). Microwave energy was then delivered into the chamber and the temperature maintained at 70° C. (below the boiling point 78° C. of ethanol) for 3 minutes. The fluid mixture penetrated into the pores and provided nano-scale agitation of the polar molecules within the pores of the dielectric film to dissolve the PMMA residues and more effectively get them out of the pores.

The PMMA residues are preferably removed by one or more rinse cycles. However, water alone does not wet the dielectric film so a little ethanol as a wetting agent (<10%) was used. Microwave was again used to provide the nano-scale agitation and rinsing within the pores of the dielectric film. This was followed with another high temperature microwave heating step described (in vacuum and $N_2$ flow) above for another half the soak time shown in the data in FIGS. 4 and 5.

For plots having N in the legend, there was 'No' solvent process used, so it had only the two (half time) soaks at the temperature indicated. FIG. 4 shows the effect of time at 370° C. As the time at temperature is increased the FTIR peak intensity for C=O is decreased, pointing to a better removal of PMMA. What is striking again is that for the same time (3 different times) the N peak is higher than the EW peak, illustrating the efficient role played by the solvent in presence of microwaves to eliminate PMMA from within the pores.

The plots for EW at 370° C. 20 minutes and 30 minutes are essentially the same, which means 20 minutes were sufficient and there is no need to go to 30 minutes at this temperature. Moreover, 20 minutes with ethanol+water much is better than 30 minutes with no polar solvent.

FIG. 5 shows the effect of temperature at soak time of 20 minutes. As the temperature is increased from 330 to 410° C. the FTIR peak intensity for C=O is decreased, pointing to a better removal of PMMA. What is striking again is that for the same temperature (3 different temperatures) the N peak is higher than the EW peak, illustrating the efficient role played by the solvent in presence of microwaves to eliminate PMMA from within the pores. However, as one goes higher in temperature the difference between N and EW diminishes, because temperature becomes the dominant player. Nevertheless, this demonstrates the capability to reduce the process temperature and yet get better removal of the stuffed PMMA at lower temperature—achieving the goal of reduced thermal budget in semiconductor manufacturing. It will be appreciated that one could add more cycles to have multiple exposures to the solvent and microwaves as shown in FIG. 2 if needed to achieve optimal properties in a particular application.

The above cleaning approach thus improves the overall process of using pore stuffing to mitigate the physical damage to the porous films structure.

The above examples discuss some preferred means for delivering solvent or reagent vapors to infiltrate porous dielectric films and assist in completing a desired reaction, followed by an in-situ heat treatment to completely cure or densify the dielectric film.

It will be appreciated that although some of the foregoing examples and discussion were presented with particular reference to VFM systems using a TWT amplifier as taught in several of the cited references, the invention includes any and all systems that may employ microwave generators using single or multiple magnetrons, klystrons, gyrotrons, or other microwave power generating devices as are well known in the art. The applicator cavity will generally be multimode for larger substrates, but for smaller specimens a single-mode applicator as is well known in the art may be also be used.

We claim:

1. A method for processing a stuffed dielectric film on a substrate, comprising:
   receiving a workpiece, comprising a substrate and a porous dielectric film in which the porosity contains a polymeric stuffing material;
   placing said workpiece in a microwave applicator cavity and heating said workpiece to a first selected temperature to at least partially burn out said polymeric stuffing material;
   introducing a controlled amount of a selected polar solvent into the porosity created by said partial burn out;
   applying microwave energy to heat said workpiece to a second selected temperature lower than the boiling point of said selected polar solvent to clean away the remaining polymeric stuffing material, wherein said cleaning process is enhanced by the interaction of said microwave energy with said polar solvent; and,
   applying microwave energy to heat said workpiece to a third selected temperature above the boiling point of said polar solvent to completely burn out residues of the polymeric stuffing material.

2. The method of claim 1, wherein said substrate comprises a semiconductor wafer and said porous dielectric film is selected from the group consisting of: low-k dielectric films and organo-silicate glass films.

3. The method of claim 1, wherein said polymeric stuffing material is selected from the group consisting of PMMA and derivatives thereof.

4. The method of claim 3, wherein said polymeric stuffing material has a molecular weight from about 1000 to about 7000 g/mol.

5. The method of claim 1, wherein said polar solvent is selected from the group consisting of:
   water, methanol, ethanol, isopropanol, acetic acid, acetone, n-propanol, n-butanol, formic acid, propylene carbonate, ethyl acetate, dimethyl sulfoxide, acetonitrile, dimethylformamide, tetrahydrofuran, dichloromethane, and mixtures thereof.

6. The method of claim 1, wherein said polar solvent is introduced into said porous dielectric film by dispensing in liquid form onto the surface of said porous dielectric film.

7. The method of claim 1, wherein said polar solvent is introduced into said porous dielectric film by equilibration of said porous dielectric film in a chamber containing a controlled vapor pressure of said polar solvent.

8. The method of claim 1, wherein said polar solvent is introduced into said porous dielectric film as part of a rinsing process.

9. The method of claim 1, wherein said partial burn out is done at a temperature between about 370 and 410° C., and said cleaning process is done at a temperature below the boiling point of said polar solvent.

10. A method for processing a dielectric film on a substrate, comprising:
    depositing a porous dielectric film on a selected substrate;
    stuffing the porosity of said porous dielectric film with a protective polymeric material;
    performing at least one intermediate processing step on said stuffed porous dielectric film;
    placing said porous dielectric film in a microwave applicator cavity and heating said porous dielectric film to a first selected temperature to at least partially burn out said polymeric material;
    introducing a controlled amount of a selected polar solvent into the porosity created by said partial burn out;
    applying microwave energy to heat said porous dielectric film to a second selected temperature below the boiling point of said polar solvent to clean away the remaining polymeric material, wherein said cleaning process is enhanced by the interaction of said microwave energy with said polar solvent;
    and, applying microwave energy to heat said porous dielectric film to a third selected (higher) temperature to completely burnout the residues of the polymeric material.

11. The method of claim 10, wherein said selected substrate comprises a semiconductor wafer and said porous dielectric film is selected from the group consisting of: low-k dielectric films and organo-silicate glass films.

12. The method of claim 10, wherein said polymeric material is selected from the group consisting of PMMA and derivatives thereof.

13. The method of claim 12, wherein said polymeric material has a molecular weight from about 1000 to about 7000 g/mol.

14. The method of claim 10, wherein said polar solvent is selected from the group consisting of: water, methanol, ethanol, isopropanol, acetic acid, acetone, n-propanol, n-butanol, formic acid, propylene carbonate, ethyl acetate, dimethyl sulfoxide, acetonitrile, dimethylformamide, tetrahydrofuran, dichloromethane, and mixtures thereof.

15. The method of claim 10, wherein said polar solvent is introduced into said porous dielectric film by dispensing in liquid form onto the surface of said porous dielectric film.

16. The method of claim 10, wherein said polar solvent is introduced into said porous dielectric film by equilibration of said porous dielectric film in a chamber containing a controlled vapor pressure of said polar solvent.

17. The method of claim 10, wherein said polar solvent is introduced into said porous dielectric film as part of a rinsing process.

18. The method of claim 10, wherein said partial burn out is done at a temperature between about 370 and 410° C., and said cleaning process is done at a temperature below the boiling point of said polar solvent.

19. The method of claim 10, wherein said intermediate processing step is selected from the group consisting of: patterning; etching; plasma processing; chemical mechanical planarization; plating; CVD coating; PECVD coating; and spin-on coating.

20. The method of claim 1, further comprising, prior to placing the workpiece in the microwave applicator cavity:
    depositing the porous dielectric film on the substrate;
    stuffing the porosity of the porous dielectric film with a protective polymeric material; and
    performing at least one intermediate processing step on the stuffed porous dielectric film.

* * * * *